(12) United States Patent
Kim et al.

(10) Patent No.: US 12,016,233 B2
(45) Date of Patent: Jun. 18, 2024

(54) DISPLAY DEVICE

(71) Applicant: Samsung Display Co., Ltd., Yongin-si (KR)

(72) Inventors: Inok Kim, Osan-si (KR); Youyoung Jin, Suwon-si (KR); Yousik Shin, Suwon-si (KR); Keunchan Oh, Hwaseong-si (KR); Gak Seok Lee, Hwaseong-si (KR); Sungjoon Cho, Seoul (KR); Sun-Kyu Joo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 200 days.

(21) Appl. No.: 17/356,190

(22) Filed: Jun. 23, 2021

(65) Prior Publication Data

US 2022/0102433 A1 Mar. 31, 2022

(30) Foreign Application Priority Data

Sep. 28, 2020 (KR) .................. 10-2020-0126114

(51) Int. Cl.
*H10K 59/38* (2023.01)
*H10K 50/858* (2023.01)

(52) U.S. Cl.
CPC .......... *H10K 59/38* (2023.02); *H10K 50/858* (2023.02)

(58) Field of Classification Search
CPC ............. G02F 2/02; G02F 2001/01791; G02F 1/133514; H01L 33/50; H01L 33/507; H01L 27/322; H10K 59/38; H10K 50/858; H05B 33/145; B82Y 30/00; C01P 2004/64

See application file for complete search history.

(56) References Cited

U.S. PATENT DOCUMENTS

| | | |
|---|---|---|
| 10,678,091 B2 | 6/2020 | Lee et al. |
| 11,650,363 B2 | 5/2023 | Lee et al. |
| 2007/0201056 A1* | 8/2007 | Cok .......... B82Y 30/00 358/1.9 |
| 2015/0323711 A1* | 11/2015 | Bessho ............ G02F 1/133606 349/71 |
| 2017/0131439 A1* | 5/2017 | Kobori ................ C08J 7/18 |
| 2019/0072818 A1* | 3/2019 | Jung ................ G02F 1/133514 |
| 2019/0121176 A1* | 4/2019 | Lee .................. G02F 1/1336 |
| 2019/0219875 A1* | 7/2019 | Jung ................ G02F 1/133502 |
| 2021/0302781 A1* | 9/2021 | Lee .......................... H01B 1/04 |

FOREIGN PATENT DOCUMENTS

| | | | |
|---|---|---|---|
| EP | 3477369 A1 | 5/2019 | |
| EP | 3605162 A2 | 2/2020 | |
| JP | 4959067 B2 | 6/2012 | |
| KR | 10-1158323 B1 | 6/2012 | |

* cited by examiner

*Primary Examiner* — Jonathan Y Jung
(74) *Attorney, Agent, or Firm* — Lewis Roca Rothgerber Christie LLP

(57) ABSTRACT

A display device may include a substrate, a first color conversion layer on the substrate, a low refractive layer on the first color conversion layer and including low refractive structures, a planarization layer on the low refractive layer, and a first color filter on the planarization layer. The planarization layer may also be between the low refractive structures.

21 Claims, 10 Drawing Sheets

DISPLAY DEVICE

CROSS-REFERENCE TO RELATED APPLICATION(S)

This application claims priority to and the benefit of Korean Patent Application No. 10-2020-0126114, filed on Sep. 28, 2020, the entire content of which is hereby incorporated by reference.

BACKGROUND

1. Field

Embodiments relate to a display device and more particularly, to a display device with improved luminous efficiency.

2. Description of the Related Art

Recently, display devices have been used in various suitable electronic devices such as smart phones, tablets, notebook computers, and home appliances. Accordingly, research is being conducted regarding how to increase the luminous efficiency of the display device. For example, research is being conducted regarding how to emit light of a desired color by disposing a color conversion material and a color filter in the display device.

When light having a specific wavelength (e.g., blue light) passes through the color conversion material, it may be converted into light having a different wavelength (e.g., red or green). However, the color conversion material may not be able to convert all of the light having the specific wavelength into light having the different wavelength. In this case, unconverted light may be blocked from being emitted to the outside by the color filter and may be wasted. Accordingly, the luminous efficiency of the display device may be lowered.

Accordingly, there is a demand for converting more light through the color conversion material.

SUMMARY

Aspects of embodiments of the present disclosure are directed towards a display device having improved luminous efficiency.

A display device according to an embodiment may include a substrate, a first color conversion layer on the substrate, a low refractive layer on the first color conversion layer and including low refractive structures, a planarization layer on the low refractive layer, and a first color filter on the planarization layer, wherein the planarization layer may be also between the low refractive structures.

In an embodiment, the display device may further include a second color conversion layer and a compensation layer, each being on the substrate and on a same layer as the first color conversion layer is on.

In an embodiment, the low refractive layer may be also on the second color conversion layer.

In an embodiment, the low refractive layer may be also on each of the second color conversion layer and the compensation layer.

In an embodiment, the first color conversion layer, the second color conversion layer, and the compensation layer may be separated from each other by a partition wall, respectively.

In an embodiment, the display device may further include a second color filter and a third color filter on the planarization layer, wherein the first color filter may overlap the first color conversion layer, the second color filter may overlap the second color conversion layer, and the third color filter may overlap the compensation layer.

In an embodiment, at least some of the low refractive structures may be different from the remaining low refractive structures in index of refraction.

In an embodiment, a shell of at least some of the low refractive structures and a shell of the remaining low refractive structures may be different from each other in thickness.

In an embodiment, the low refractive structures may include (e.g., be) a silica-based material.

In an embodiment, the planarization layer may include (e.g., be) an organic material.

In an embodiment, the planarization layer may include (e.g., be) an inorganic material.

A display device according to an embodiment may include a substrate, a first color conversion layer on the substrate, a low refractive layer on the first color conversion layer and including a low refractive structures, and a first color filter on the low refractive layer, wherein the first color filter may be also between the low refractive structures.

In an embodiment, the display device may further include a second color conversion layer and a compensation layer, each being on the substrate and on a same layer as the first color conversion layer is on.

In an embodiment, the low refractive layer may be also on the second color conversion layer.

In an embodiment, the low refractive layer may be also on each of the second color conversion layer and the compensation layer.

In an embodiment, the first color conversion layer, the second color conversion layer, and the compensation layer may be separated from each other by a partition wall, respectively.

In an embodiment, the display device may further include a second color filter and a third color filter, each being on the low refractive layer, wherein the first color filter may overlap the first color conversion layer, the second color filter may overlap the second color conversion layer, and the third color filter may overlap the compensation layer, and wherein the second color filter and the third color filter may each be between the low refractive structures.

In an embodiment, at least some of the low refractive structures may be different from the remaining low refractive structures in index of refraction.

In an embodiment, a shell of at least some of the low refractive structures and a shell of the remaining low refractive structures may be different from each other in thickness.

In an embodiment, the low refractive structures may include (e.g., be) a silica-based material.

The display device according to embodiments may include a color conversion layer and a low refractive layer disposed on the color conversion layer. The low refractive layer may include low refractive structures. The low refractive structures may be disposed together with a separate solvent and then independently disposed by evaporating the solvent.

Accordingly, the low refractive layer may prevent or reduce an increase in the overall refractive index of the low refractive layer due to the high refractive index of the solvent. Therefore, the low refractive layer may transmit light of a set or specific color (e.g., blue light) back to the color conversion layer to be converted to light of a desired color (e.g., green light or red light). Accordingly, the luminous efficiency of the display device may be increased.

BRIEF DESCRIPTION OF THE DRAWINGS

Illustrative, non-limiting embodiments will be more clearly understood from the following detailed description taken in conjunction with the accompanying drawings in which.

DETAILED DESCRIPTION

Hereinafter, display devices in accordance with embodiments will be explained in more detail with reference to the accompanying drawings.

As used herein, the use of the term "may," when describing embodiments of the present disclosure, refers to "one or more embodiments of the present disclosure." As used herein, the term "and/or" includes any and all combinations of one or more of the associated listed items. As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 1:
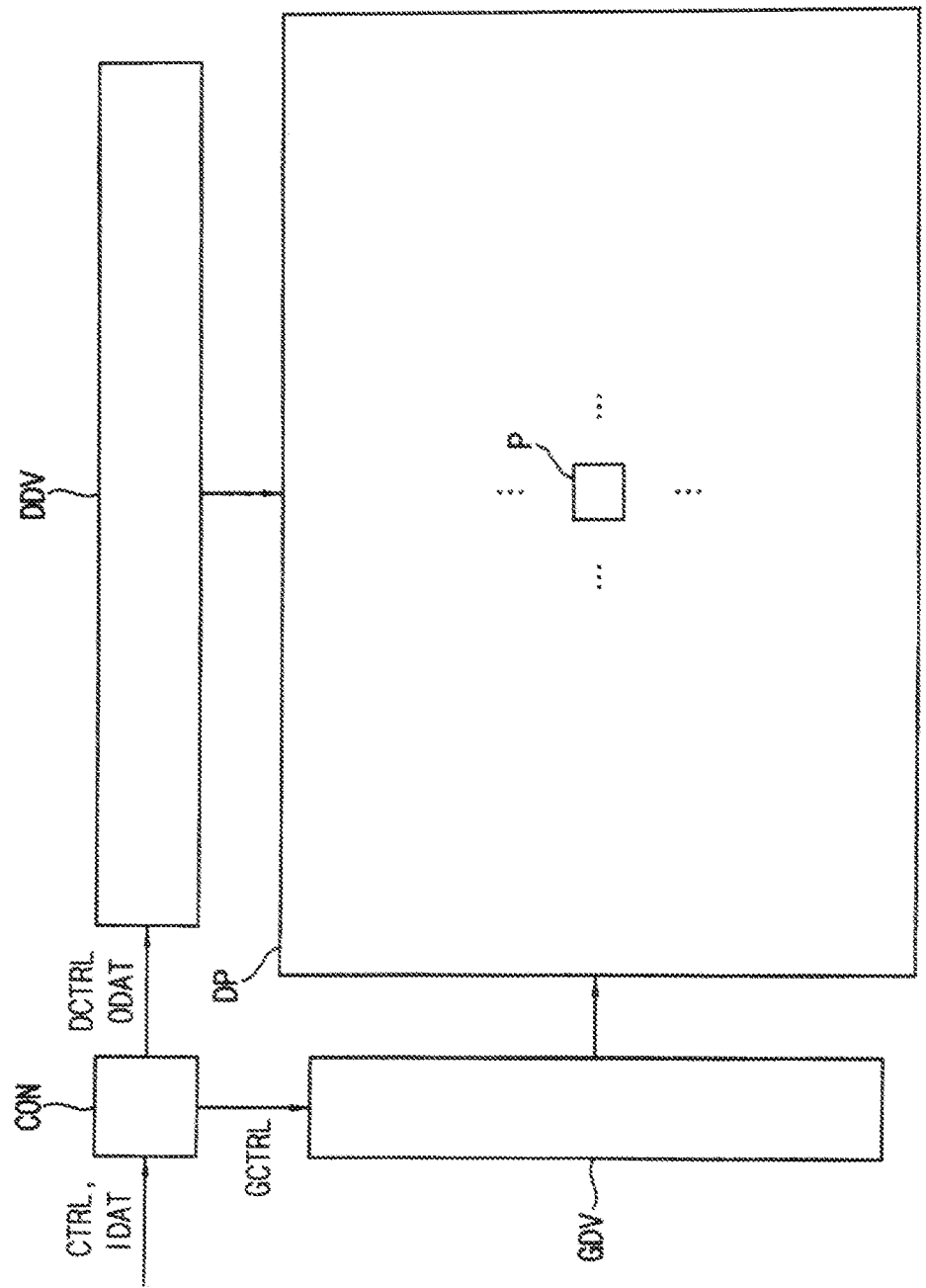
FIG. 1 is a plan view illustrating a display device according to an embodiment.

FIG. 1 is a plan view illustrating a display device according to an embodiment.

Referring to FIG. 1, the display device may include a display panel DP, a data driver DDV, a gate driver GDV, and a timing controller CON.

In some embodiments, the display panel may be integrally formed. In some embodiments, the display panel DP may include a plurality of sub-display panels.

The display panel DP may include a plurality of pixels P. Each of the plurality of pixels P may include a light emitting diode. The display panel DP may display an image through the light emitting diodes. For example, the light emitting diodes may include any one selected from an organic light emitting diode, a quantum-dot organic light emitting diode, and a quantum-dot nano light emitting diode. In some embodiments, the display device may include a liquid crystal display device.

The timing controller CON may generate a gate control signal GCTRL, a data control signal DCTRL, and output image data ODAT based on a control signal CTRL and input image data IDAT provided from the outside. For example, the control signal CTRL may include a vertical synchronization signal, a horizontal synchronization signal, an input data enable signal, a master clock signal, and/or the like. In some embodiments, the input image data IDAT may be RGB data including red image data, green image data, and blue image data. In some embodiments, the input image data IDAT may include magenta image data, cyan image data, and yellow image data.

The gate driver GDV may generate gate signals based on the gate control signal GCTRL provided from the timing controller CON. For example, the gate control signal GCTRL may include a vertical start signal and a clock signal.

The gate driver GDV may be electrically coupled (e.g., connected) to the display panel DP, and may sequentially output the gate signals. Each of the pixels P may receive a data voltage according to the control of each of the gate signals.

The data driver DDV may generate the data voltage based on the data control signal DCTRL and the output image data ODAT provided from the timing controller CON. For example, the data control signal DCTRL may include an output data enable signal, a horizontal start signal, and/or a load signal.

The data driver DDV is electrically coupled (e.g., connected) to the display panel DP and may generate a plurality of data voltages. Each of the pixels P may display an image by receiving a signal for luminance corresponding to each of the data voltages.

Figure 2:
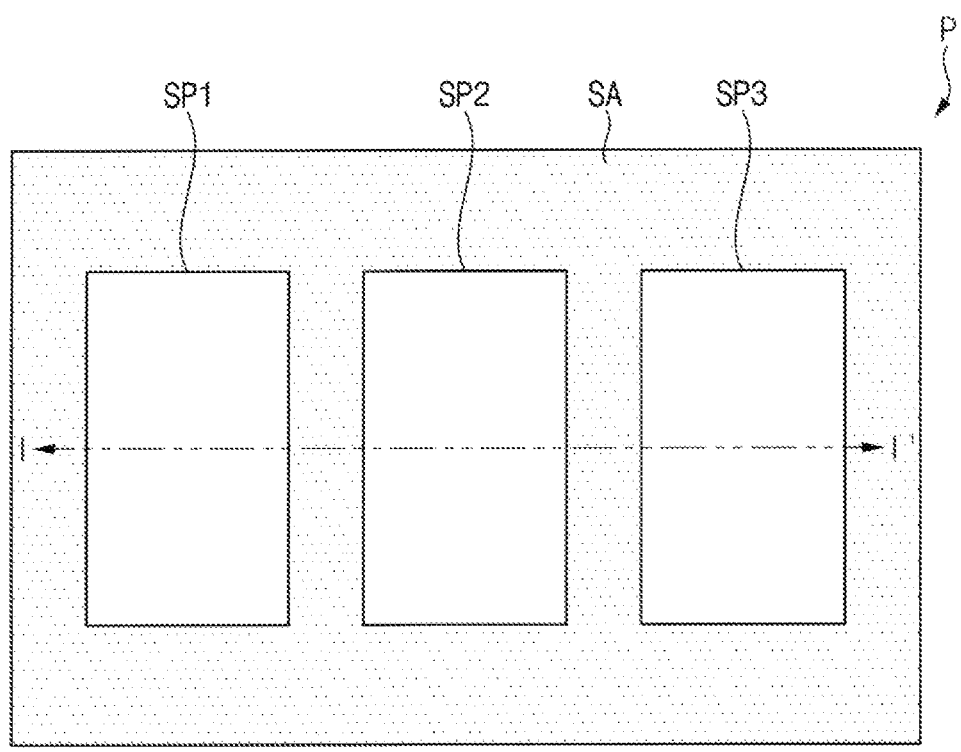
FIG. 2 is a plan view illustrating embodiments of a pixel disposed in the display device of FIG. 1.
Figure 3:
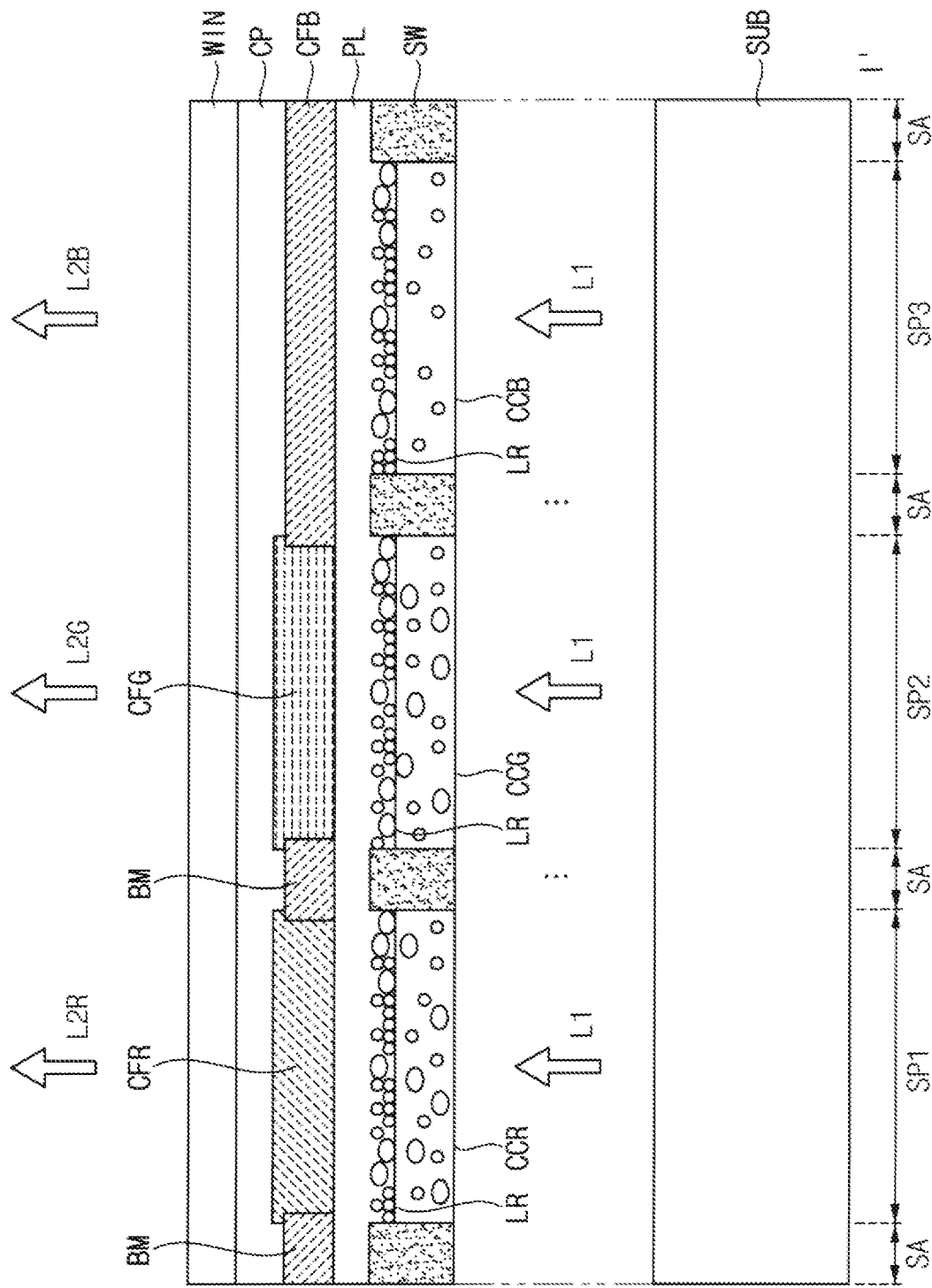
FIG. 3 is a cross-sectional view illustrating embodiments taken along the line I-I' of FIG. 2.
Figure 4:
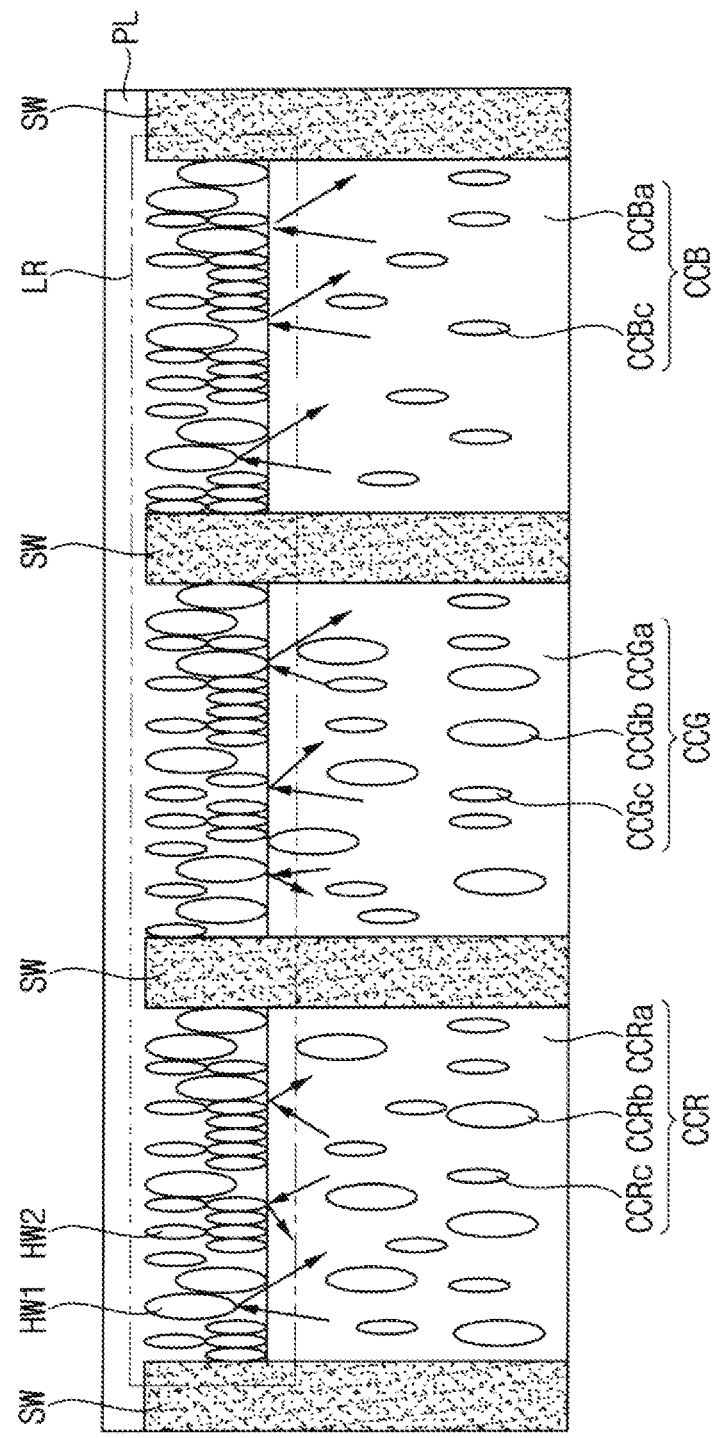
FIG. 4 is a cross-sectional view illustrating embodiments of a color conversion layer, a low refractive layer, and a planarization layer of the display device of FIG. 1.

FIG. 2 is a plan view illustrating embodiments of a pixel disposed in the display device of FIG. 1, FIG. 3 is a cross-sectional view illustrating embodiments taken along the line I-I' of FIG. 2, and FIG. 4 is a cross-sectional view illustrating embodiments of a color conversion layer, a low refractive layer, and a planarization layer of the display device of FIG. 1.

Referring to FIGS. 2 to 4, each of the plurality of pixels P may include sub-pixels. For example, each of the plurality of pixels P may include first to third sub-pixels SP1, SP2, SP3. A peripheral area around (e.g., surrounding) the first to third sub-pixels SP1, SP2, SP3 may be defined as a light blocking area SA. In some embodiments, a partition wall SW, a light blocking pattern BM, and the like may be disposed in the light blocking area SA.

In FIG. 2, the first to third sub-pixels SP1, SP2, and SP3 are shown to be spaced apart in one direction, but the arrangement of the first to third sub-pixels SP1, SP2, SP3 is not limited thereto. For example, the first to third sub-pixels SP1, SP2, SP3 may be arranged in a zigzag shape. For example, the first to third sub-pixels SP1, SP2, SP3 may be arranged with each other in a triangular shape.

The display device may include a substrate SUB, a partition wall SW, a first color conversion layer CCR, a second color conversion layer CCG, a compensation layer CCB, a low refractive layer LR, a planarization layer PL, first to third color filters CFR, CFG, CFB, a light blocking member BM, a capping layer CP, and a window WIN.

The substrate SUB may include a plurality of elements. For example, the substrate SUB may include a transistor and a light emitting diode. This will be described later with reference to FIG. 10.

The partition wall SW may be disposed on the substrate SUB. The partition wall SW may be around (e.g., may surround) the first color conversion layer CCR, the second color conversion layer CCG, and the compensation layer CCB, respectively. Accordingly, the first color conversion layer CCR, the second color conversion layer CCG, and the compensation layer CCB may be spaced apart from each other.

The first color conversion layer CCR may include (e.g., be) a base resin CCRa, wavelength conversion particles CCRb, and scattering particles CCRc.

In some embodiments, the wavelength conversion particles CCRb may include quantum dots. The quantum dot may be defined as a semiconductor material having nano crystals. The quantum dots may have a set or specific band gap depending on the composition and size of the quantum dots. Accordingly, by absorbing incident light, light having a wavelength different from the wavelength of the incident light may be emitted. For example, the quantum dots may have a diameter of 100 nm or less, and preferably may have a diameter of 1 nm to 20 nm.

For example, the quantum dots may include a group II-VI compound, a group III-V compound, a group IV-VI compound, a group IV element, a group IV compound, or one or more combinations thereof.

For example, the group II-VI compound may be selected from a binary compound selected from the group consisting of CdSe, CdTe, ZnS, ZnSe, ZnTe, ZnO, HgS, HgSe, HgTe, MgSe, MgS, and mixtures thereof; a ternary (e.g., three-element) compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

For example, the III-V group compound may be selected from a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof; and a quaternary compound selected from the group consisting of GaAlNAs, GaAlNP, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

For example, the group IV-VI compound may be selected from a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof.

For example, the group IV element may be selected from the group consisting of Si, Ge, and mixtures thereof. The group IV compound may be a binary compound selected from the group consisting of SiC, SiGe, and mixtures thereof.

In some embodiments, the quantum dot may have a core/shell structure including a core and a shell around (e.g., surrounding) the core. For example, the core and the shell may include (e.g., be) different materials.

The quantum dots may be dispersed in the base resin CCRa. For example, the base resin CCRa may include (e.g., be) an epoxy resin, an acrylic resin, a phenol resin, a melamine resin, a cardo resin, an imide resin, and/or the like.

The scattering particles CCRc may increase an optical path (e.g., an optical path of incident light propagating through the first color conversion layer CCR from a lower surface of the first color conversion layer CCR to an upper surface of the first color conversion layer CCR) by scattering the incident light without substantially changing a wavelength of light incident on the first color conversion layer CCR.

The scattering particles CCRc may include (e.g., be) a metal oxide and/or an organic material. For example, the metal oxide may include (e.g., be) titanium oxide $TiO_2$ ($TiO_2$), zirconium oxide $ZrO2$ ($ZrO_2$), aluminum oxide $Al2O3$ ($Al_2O_3$), indium oxide $In2O3$ ($In_2O_3$), zinc oxide (ZnO), tin oxide $SnO2$ ($SnO_2$), and/or the like, and the organic material may include (e.g., be) an acrylic resin and/or a urethane resin.

For example, the first color conversion layer CCR may excite or convert the incident blue light L1 to emit red light L2R. Blue light L1 that is not excited or converted by the first color conversion layer CCR may be blocked by the first color filter CFR (e.g., a first color filter layer). For example, the red light L2R may have a peak wavelength in a range of about 610 nm to 650 nm.

The second color conversion layer CCG may include a base resin CCGa, wavelength conversion particles CCGb, and scattering particles CCGc. For example, the second color conversion layer CCG may excite or convert the incident blue light L1 to emit green light L2G. Blue light L1 that is not excited or converted by the second color conversion layer CCG may be blocked by the green color filter CFG. For example, the green light L2G may have a peak wavelength in a range of about 510 nm to 550 nm.

The compensation layer CCB may include a base resin CCBa. For example, the base resins CCBa and CCGa may include (e.g., be) the same material as the base resin CCRa. In addition, the compensation layer CCB may further include a scattering particles CCBc.

In some embodiments, the compensation layer CCB may further include (e.g., be) a wavelength conversion material to improve color quality and increase color conversion efficiency. For example, the wavelength conversion material may emit blue light by excitation or conversion of ultraviolet rays or light in a wavelength range at about or approximating that of ultraviolet rays.

The partition wall SW may be around (e.g., may surround) side surfaces of the first color conversion layer CCR, the second color conversion layer CCG, and the compensation layer CCB. The partition wall SW may form a space for accommodating (e.g., for receiving) an ink composition in the process of forming the first color conversion layer CCR, the second color conversion layer CCG, and the compensation layer CCB. Accordingly, the partition wall SW may have a grid shape or a matrix shape on a plan view.

For example, the partition wall SW may include (e.g., be) an organic material such as an epoxy resin, a phenolic resin, an acrylic resin, and/or a silicone resin.

In some embodiments, the partition wall SW may include (e.g., be) a light blocking material to serve as a black matrix. For example, at least a portion of the partition wall SW may include (e.g., be) a light blocking material such as a pigment, a dye, and/or carbon black. Accordingly, the partition wall SW may be disposed to overlap the light blocking area SA.

The partition wall SW may have a single layer structure or a multilayer structure. For example, the partition wall SW may be designed to have a set or predetermined thickness in order to function as a partition wall capable of accommodating an ink composition, and for this purpose, a partition wall having a multilayer structure may be formed. In some embodiments, the thickness of the partition wall SW may be greater than a thickness of the first color conversion layer CCR, the second color conversion layer CCG, and/or the compensation layer CCB.

The low refractive layer LR may be disposed on the first color conversion layer CCR, the second color conversion layer CCG, and the compensation layer CCB. The low refractive layer LR may include low refractive structures. For example, the low refractive layer LR may include a first low refractive structure HW1 and a second low refractive structure HW2. In some embodiments, the low refractive structures may include (e.g., be) a silica-based material. For example, the low refractive structures may include (e.g., be) hollow silica. The low refractive structures may have, for example, a spherical shape.

In some embodiments, the low refractive layer LR may selectively reflect blue light transmitted from the first color conversion layer CCR without changing to red back to the first color conversion layer CCR. The low refractive layer LR may selectively reflect blue light transmitted from the second color conversion layer CCG without changing to green back to the second color conversion layer CCG. For example, the low refractive layer LR may reflect blue light transmitted from the first and second color conversion layers CCR and CCG, which was not converted by the first and second color conversion layers CCR and CCG into red and green light, respectively, back to the first and second color conversion layers CCR and CCG, respectively.

In some embodiments, sizes (e.g., volumes and/or diameters) of the first low refractive structure HW1 and the second low-refractive structure HW2 may be different from each other. Accordingly, refractive indices of the first low-refractive structure HW1 and the second low-refractive structure HW2 may be different from each other. In addition, by utilizing (e.g., using) the low refractive structures HW1 and HW2 having different sizes, the low refractive layer LR may be disposed while minimizing or reducing an empty space.

Although it is illustrated in FIG. 3 that the low refractive structures HW1 and HW2 of two sizes are disposed in the low refractive layer LR, the present disclosure is not limited thereto. For example, low refractive structures having one or three or more sizes may be disposed in the low refractive layer LR.

In some embodiments, the low refractive structures may be disposed on the first color conversion layer CCR, the second color conversion layer CCG, and the compensation layer CCB while dissolved in a solvent. For example, during a manufacturing process of the display device, a solution including the solvent and the low refractive structures may be disposed on the first color conversion layer CCR, the second color conversion layer CCG, and the compensation layer CCB. Typically, the solvent may have a higher refractive index (i.e., index of refraction) than the low refractive structure. Therefore, if the solvent remains, the refractive index of the low refractive layer may increase (e.g., may be higher than if the solvent did not remain).

To prevent this or to reduce the increase of the refractive index of the low refractive layer, the solvent may include (e.g., be) alcohols with strong volatility. For example, the solvent may include (e.g., be) isopropyl alcohol. Therefore, the solvent is easily evaporated after the low refractive structures are disposed on the first color conversion layer CCR, the second color conversion layer CCG, and the compensation layer CCB in a state in which they are dissolved in the solvent.

In addition, the alcohol-based solvent has a low boiling point and may be evaporated at low temperatures. Accordingly, the alcohol-based solvent may be evaporated by applying heat within a range that does not damage other layers of the display device.

Accordingly, the refractive index of the low refractive layer LR including only the low refractive structures may be effectively reduced.

A planarization layer PL may be disposed on the low refractive layer LR. The planarization layer PL may be disposed to cover the partition wall SW and the low refractive layer LR. In some embodiments, the planarization layer PL may be an organic layer including (e.g., being) an organic material. For example, the organic material may include (e.g., be) polyimide, polyamide, acrylic resin, benzocyclobutene, and/or phenol resin.

In some embodiments, the planarization layer PL may be an inorganic film including (e.g., being) an inorganic material. For example, the inorganic material may include (e.g., be) a silicon-based material such as silicon oxide, silicon nitride, and/or silicon oxynitride.

Because only low refractive structures (e.g., spherical low refractive structures) are disposed in the low refractive layer LR, the planarization layer PL may also be disposed between the low refractive structures. However, in some embodiments, the low refractive structures may be thickly disposed so that the planarization layer PL does not penetrate to the first color conversion layer CCR, the second color conversion layer CCG, and the compensation layer CCB. In some embodiments, during a process of forming the planarization layer PL on the low refractive layer LR, a material utilized (e.g., used) to form the planarization layer PL may permeate between the low refractive structures (e.g., the first and second low refractive structures HW1 and HW2) toward (e.g., to) each of the first color conversion layer CCR, second color conversion layer CCG, and the compensation layer CCB. However, the present disclosure is not limited thereto. For example, in some embodiments, the material utilized (e.g., used) to form the planarization layer PL may set on the low refractive structures without penetrating into the low refractive layer LR or permeating between the low refractive structures.

In some embodiments, the surface of the low refractive structures may be chemically treated so that the planarization layer PL is adsorbed to the surfaces of the low refractive structures. Accordingly, the planarization layer PL may not penetrate to the first color conversion layer CCR, the second color conversion layer CCG, and the compensation layer CCB.

The first to third color filters CFR, CFG, and CFB may be disposed on the planarization layer PL. Each of the first to third color filters CFR, CFG, and CFB may transmit light of a set or specific color. The first to third color filters CFR, CFG, and CFB may respectively overlap the first color conversion layer CCR, the second color conversion layer CCG, and the compensation layer CCB.

For example, the first color filter CFR may transmit red light. Accordingly, the first color filter CFR may overlap the first color conversion layer CCR. The second color filter CFG (e.g., second color filter layer) may transmit green light. Accordingly, the second color filter CFG may overlap the second color conversion layer CCG. The third color filter CFB (e.g., third color filter layer) may transmit blue light. Accordingly, the third color filter CFB may overlap the compensation layer CCB. In some embodiments, the first color filter CFR, the second color filter CFG, and the third color filter CFB may respectively prevent (or substantially prevent) the transmission of (e.g., block, absorb, and/or reflect) light other than red light, green light, and blue light.

In some embodiments, the light blocking member BM may be disposed to overlap a portion of the partition wall SW. The light blocking member BM may include (e.g., be) the same material as the third color filter CFB. The light blocking member BM may control the red light emitted from the first color conversion layer CCR to be emitted to the outside of the display device through a first color filter CFR. In some embodiments, the light blocking member BM may block red light emitted from the first color conversion layer CCR that is incident on the light blocking member BM. For example, the light blocking member BM may prevent or reduce color mixing between the first sub-pixel SP1 and adjacent sub-pixels SP2 and SP3. In addition, the light blocking member BM may control the green light emitted from the second color conversion layer CCG to be emitted to the outside of the display device through the second color filter CFG. In some embodiments, the light blocking member BM may block green light emitted from the second color conversion layer CCG that is incident on the light blocking member BM. For example, the light blocking member BM may prevent or reduce color mixing between the second sub-pixel SP2 and adjacent sub-pixels SP1 and SP3.

The capping layer CP may be disposed on the first color conversion layer CCR, the second color conversion layer CCG, and the compensation layer CCB. The capping layer CP may prevent or block penetration of impurities (e.g., oxygen and/or moisture). For example, the capping layer CP may have a structure in which one or more inorganic layers and one or more organic layers are alternately disposed. For example, the capping layer may include a first inorganic layer, an organic layer on the first inorganic layer, and a second inorganic layer on the organic layer.

The window WIN may be disposed on the capping layer CP. The window WIN may include (e.g., be) glass, and may protect the above-described components (e.g., the components under the window WIN) from external impact.

Figure 5:
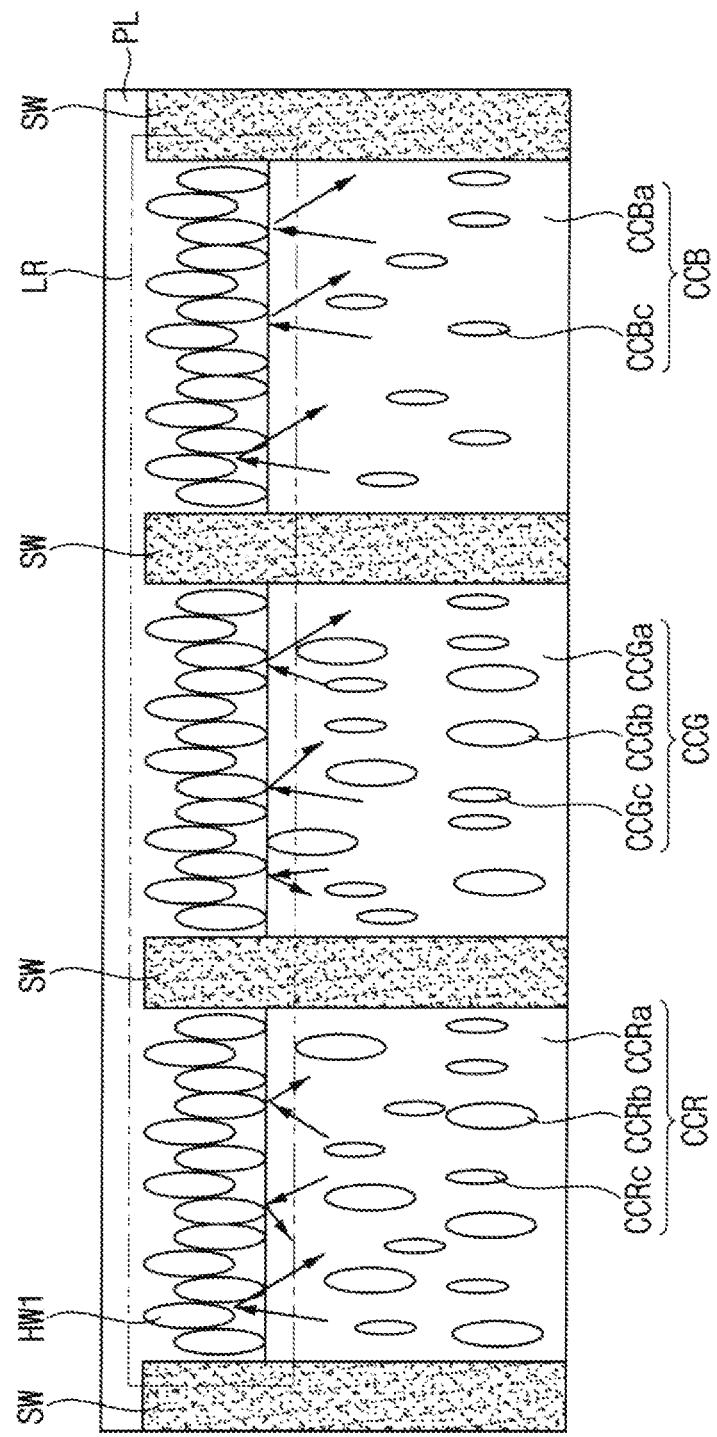
FIG. 5 is a cross-sectional view illustrating embodiments of a color conversion layer, a low refractive layer, and a planarization layer of the display device of FIG. 1.

FIG. 5 is a cross-sectional view illustrating embodiments of a color conversion layer, a low refractive layer, and a planarization layer of the display device of FIG. 1. FIG. 5 may be substantially the same as FIG. 4 except that the low refractive structures have the same size (e.g., substantially the same size). Accordingly, repeated descriptions of components similar to components in FIG. 4 may not be repeated.

Figure 6:
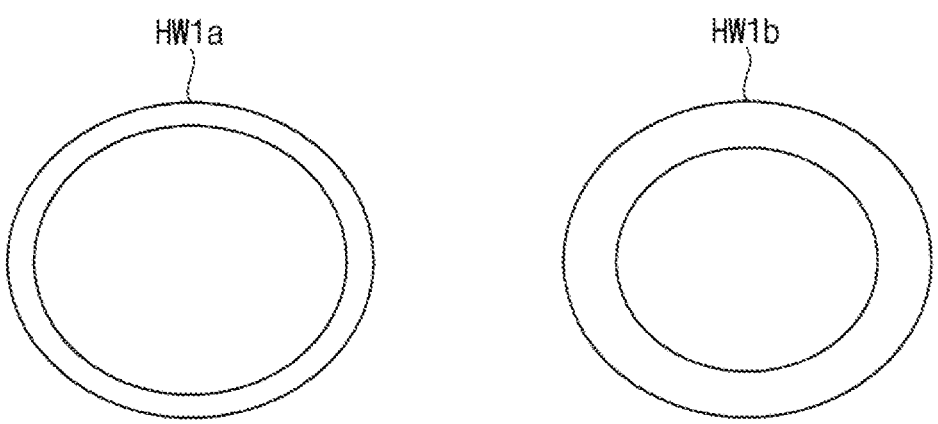
FIG. 6 is a diagram illustrating embodiments of low refractive structures of the display device of FIG. 1.

FIG. 6 is a diagram illustrating embodiments of low refractive structures of the display device of FIG. 1.

Referring to FIG. 6, the first low refractive structure HW1 may include a first sub-low-refractive structure HW1*a* and a second sub-low-refractive structure HW1*b* having different shell thicknesses. Because the shells have different thicknesses, refractive indices of the first sub-low-refractive structure HW1*a* and the second sub-low-refractive structure HW1*b* may be different from each other. In this way, various suitable refractive indices may be secured through structures having the same size but different refractive indices. Similarly, in some embodiments, the second low refractive structures HW2 may include two or more sub-low-refractive structures, each having the same size (e.g., substantially the same size) but mutually different thicknesses.

Figure 7:
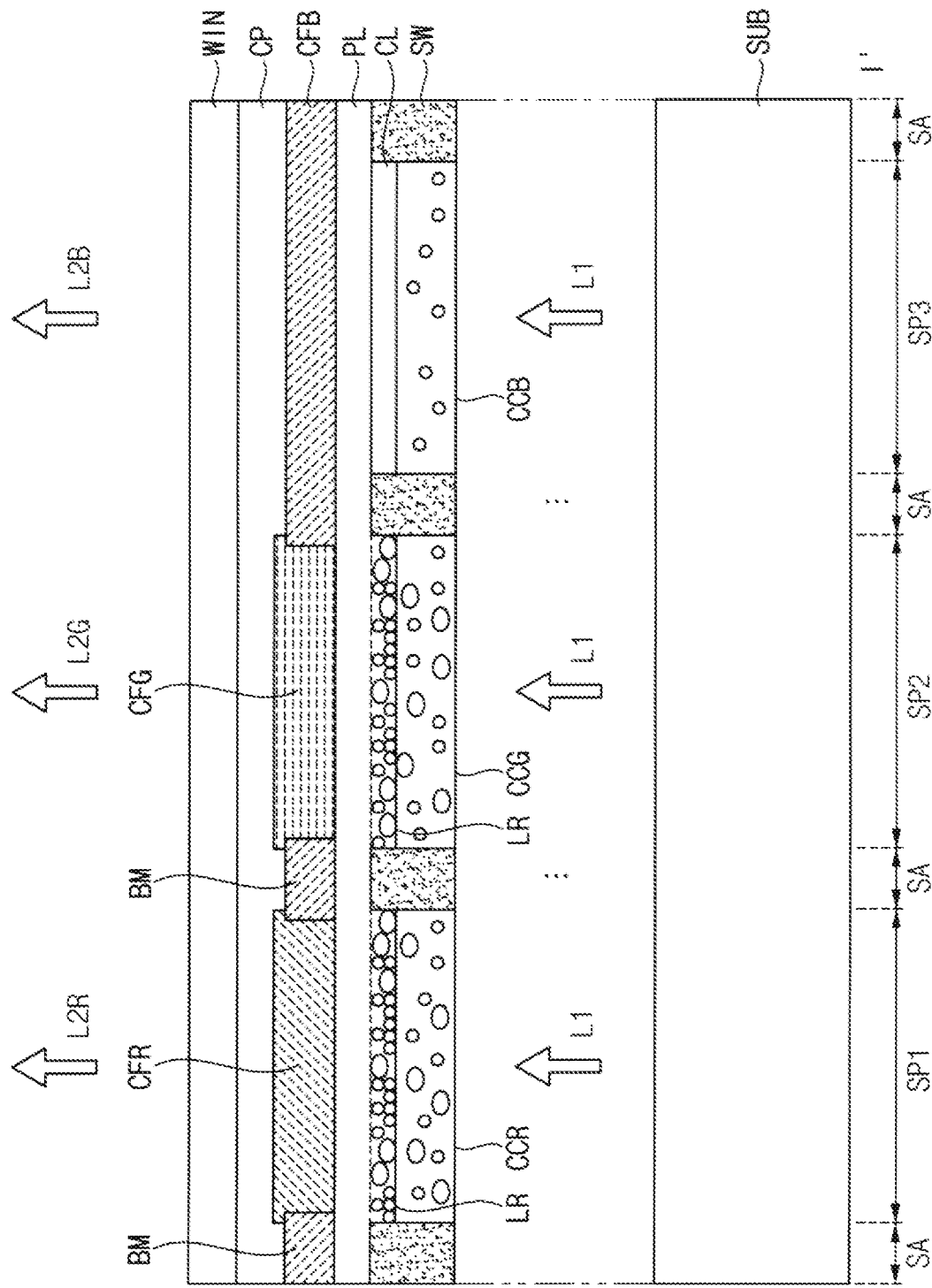
FIG. 7 is a cross-sectional view illustrating embodiments taken along the line I-I' of FIG. 2.

FIG. 7 is a cross-sectional view illustrating embodiments taken along the line I-I' of FIG. 2. FIG. 7 may be substantially the same as that of FIG. 3 except that the low refractive layer LR is not disposed on the compensation layer CCB. Accordingly, repeated descriptions of components similar to components in FIG. 4 may not be repeated.

Referring to FIG. 7, light emitted from the compensation layer CCB may be blue light. Accordingly, even if the blue light passes through the third color filter CFB as it is (e.g., without being converted), there may be no wasted light. In some embodiments, the light emitted from the first color conversion layer CCR and the second color conversion layer CCG may be red and green light, respectively. However, blue light that has not been converted into red and green light in the first color conversion layer CCR and the second color conversion layer CCG, respectively, may be absorbed by the first color filter CFR and the second color filter CFG. Accordingly, luminous efficiency may be lowered. Accordingly, the low refractive index layer LR may be selectively disposed only on the first color conversion layer CCR and the second color conversion layer CCG. However, in this case, in order to prevent or block the planarization layer PL from penetrating into the compensation layer CCB, a protective layer CL may be disposed between the planarization layer PL and the compensation layer CCB.

Figure 8:
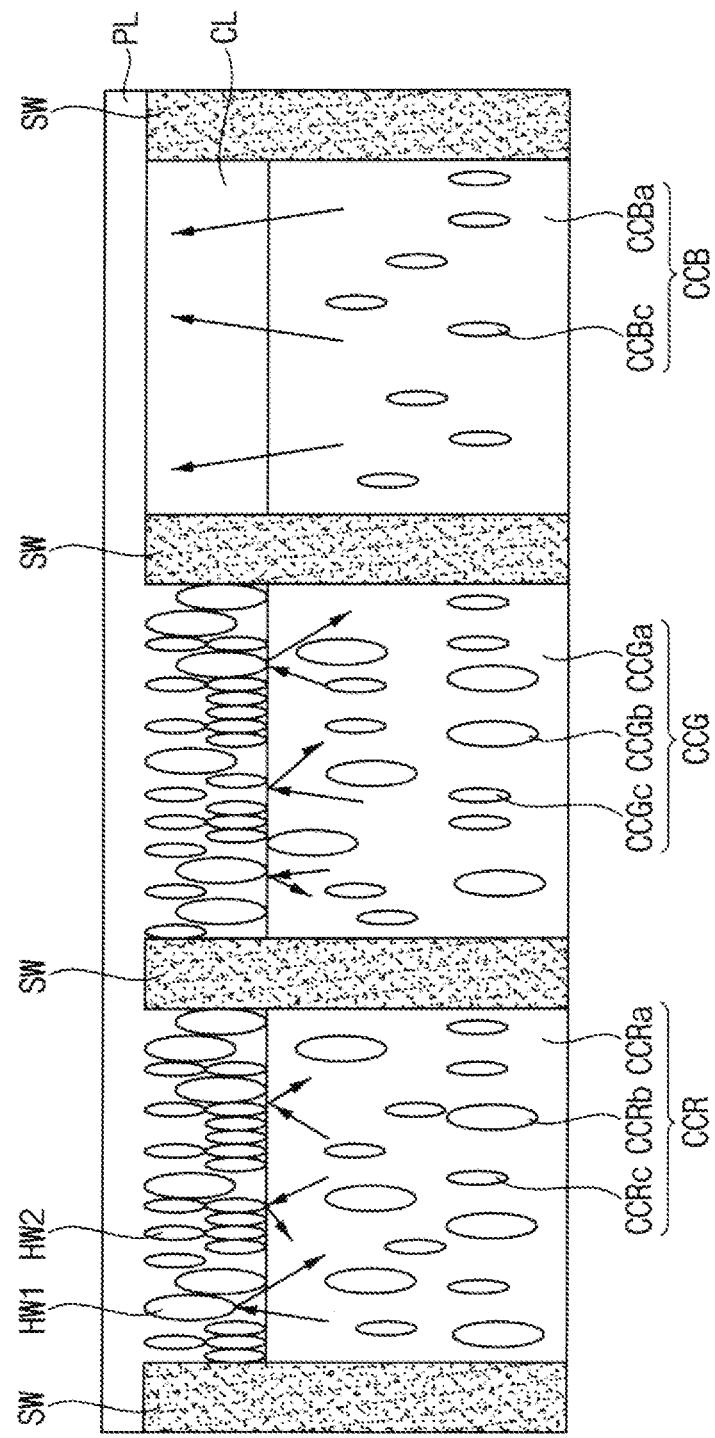
FIG. 8 is a cross-sectional view illustrating embodiments of a color conversion layer, a low refractive layer, and a planarization layer of the display device of FIG. 1.

FIG. 8 is a cross-sectional view illustrating embodiments of a color conversion layer, a low refractive layer, and a planarization layer of the display device of FIG. 1. FIG. 8 may be substantially the same as FIG. 4 except that the protection layer CL is disposed between the planarization layer PL and the compensation layer CCB instead of the low refractive layer LR. Accordingly, repeated descriptions of components similar to components in FIG. 4 may not be repeated.

Figure 9:
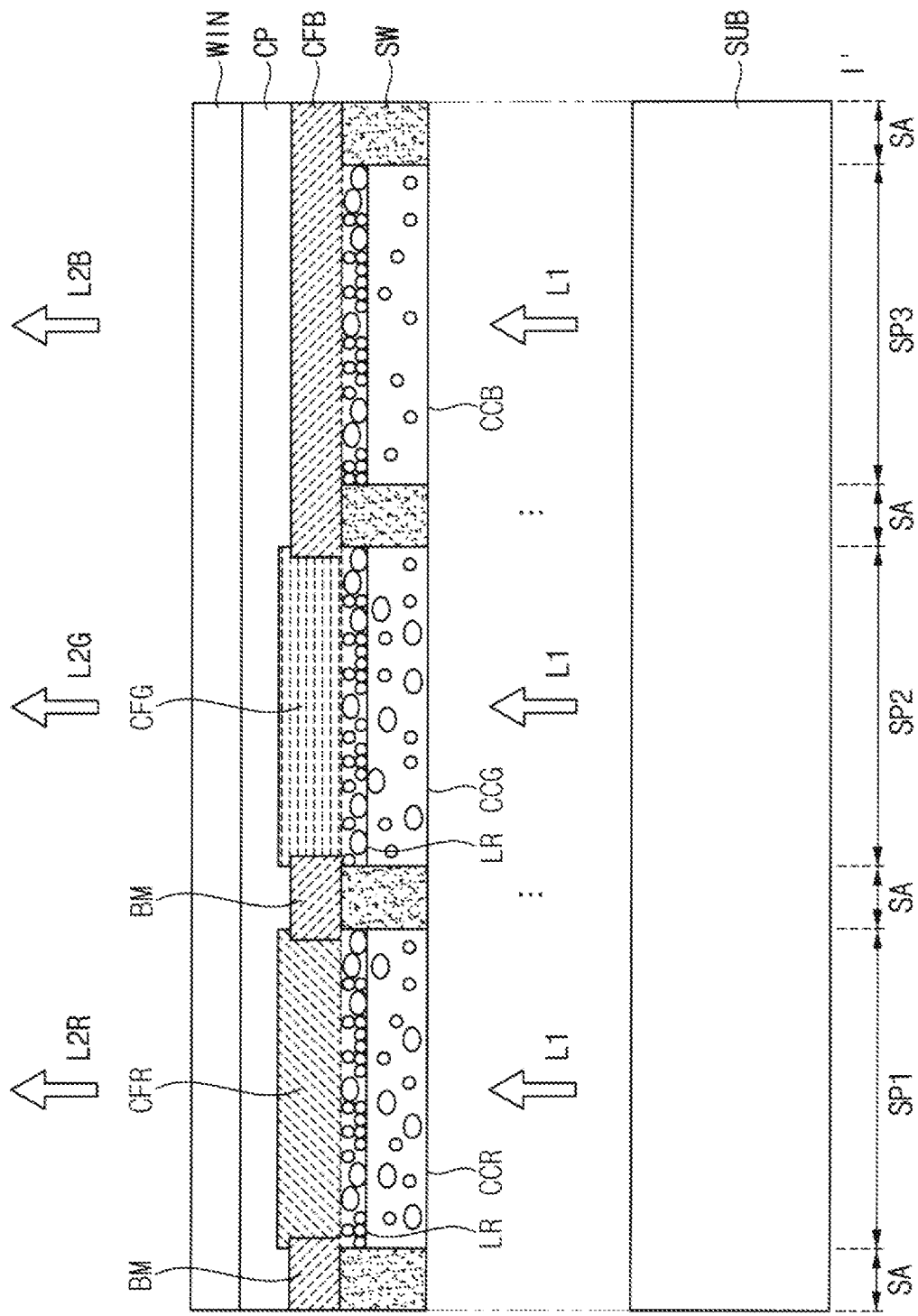
FIG. 9 is a cross-sectional view illustrating embodiments taken along the line I-I' of FIG. 2.

FIG. 9 is a cross-sectional view illustrating embodiments taken along the line I-I' of FIG. 2. FIG. 9 may be substantially the same as FIG. 3 except that the planarization layer PL is excluded. Accordingly, repeated descriptions of components similar to components in FIG. 4 may not be repeated.

Referring to FIG. 9, in the display device, the first to third color filters CFR, CFG, CFB and the light blocking member BM may be disposed on the partition wall SW and the low refractive layer LR.

Because the low refractive layer LR may include only low refractive structures (e.g., spherical low refractive structures), the first to third color filters CFR, CFG, CFB and the light blocking member BM may be also disposed between the low refractive structures. However, in some embodiments, the low refractive structures may be thickly disposed so that the first to third color filters CFR, CFG, CFB, and the light blocking member BM do not penetrate to the first color conversion layer CCR, the second color conversion layer CCG, and the compensation layer CCB.

In some embodiments, the surface of the low refractive structures may be chemically treated so that the first to third color filters CFR, CFG, CGB, and the light blocking member BM are adsorbed to the surfaces of the low refractive structures. Accordingly, the first to third color filters CFR, CFG, CFB and the light blocking member BM may not penetrate to the first color conversion layer CCR, the second color conversion layer CCG, and the compensation layer CCB.

Figure 10:
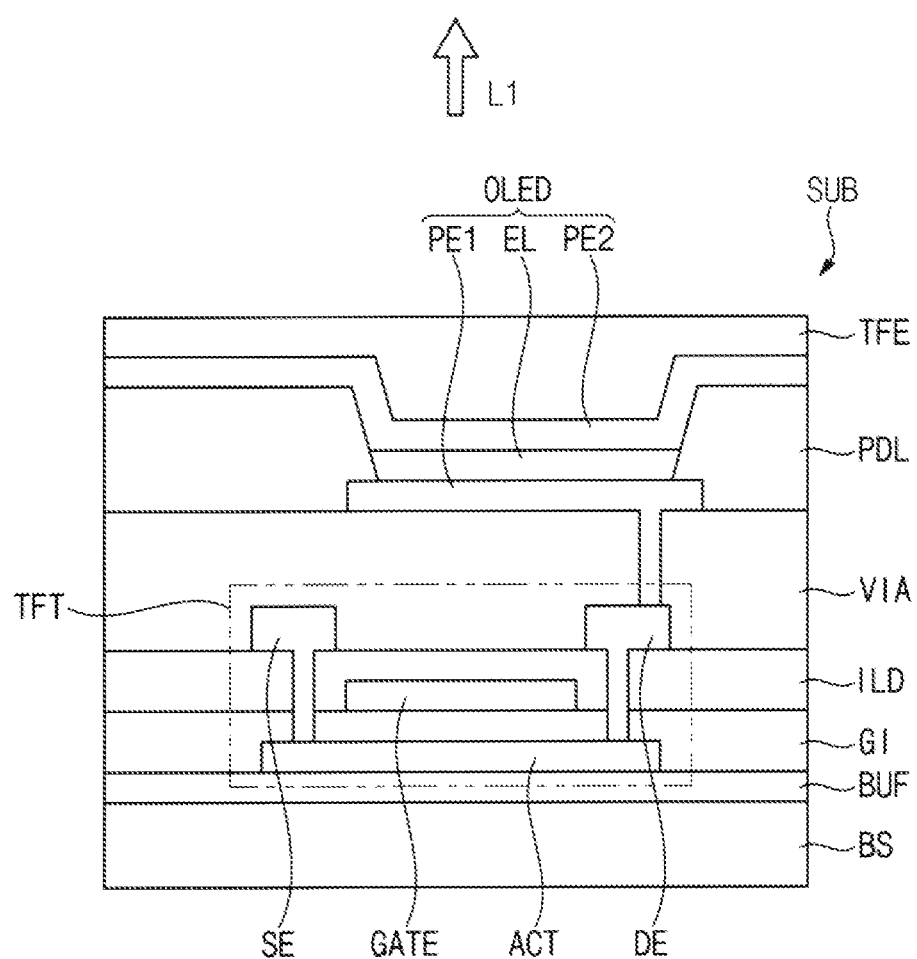
FIG. 10 is a cross-sectional view illustrating embodiments of a substrate of the display device of FIG. 1.

FIG. 10 is a cross-sectional view illustrating embodiments of a substrate of the display device of FIG. 1.

Referring to FIG. 10, the substrate SUB may include a base substrate BS, a buffer layer BUF, a gate insulating layer GI, an interlayer insulating layer ILD, a via insulating layer VIA, a transistor TFT, a pixel defining layer PDL, an organic light emitting diode OLED, and an encapsulation layer TFE. The transistor TFT may include an active layer ACT, a gate electrode GATE, a source electrode SE, and a drain electrode DE. The organic light emitting diode OLED may include a lower electrode PE1, an intermediate layer EL, and an upper electrode PE2.

The base substrate BS may include (e.g., be) a glass, quartz, plastic, and/or the like. In some embodiments, the base substrate BS may include (e.g., be) the plastic, and accordingly, the display device may have flexible characteristics. In some embodiments, the base substrate BS may have a structure in which one or more organic film layers and one or more barrier layers are alternately stacked. For example, the organic film layer may be formed utilizing (e.g., using) an organic material such as polyimide, and the barrier layer may be formed utilizing (e.g., using) an inorganic material.

The buffer layer BUF may be disposed on the base substrate BS. The buffer layer BUF may prevent or block diffusion of metal atoms and/or impurities from the base substrate BS into the active layer ACT. In addition, the buffer layer BUF may control heat (e.g., a heat supply rate and/or a heat distribution) during a crystallization process for forming the active layer ACT, and accordingly, the active layer ACT may be uniformly formed.

The active layer ACT may be disposed on the buffer layer BUF. In some embodiments, the active layer ACT may include (e.g., be) an oxide-based semiconductor material. For example, the oxide-based semiconductor material may include (e.g., be) zinc oxide ZnOx ($ZnO_x$), tin oxide SnOx ($SnO_x$), indium oxide InOx ($InO_x$), indium-zinc oxide (IZO), indium-gallium oxide (IGO), zinc-tin oxide ZnSnxOy ($ZnSn_xO_y$), and indium-gallium-zinc oxide (IGZO).

In some embodiments, the active layer ACT may include (e.g., be) a silicon-based semiconductor material. For example, the silicon-based semiconductor material may include (e.g., be) amorphous silicon, polycrystalline silicon, and/or the like.

The gate insulating layer GI may be disposed on the buffer layer BUF and may cover at least a portion of the active layer ACT. The gate insulating layer GI may include (e.g., be) silicon oxide SiOx ($SiO_x$), silicon nitride SiNx ($SiN_x$), silicon oxynitride SiNxOy ($SiN_xO_y$), and/or the like.

The gate electrode GATE may be disposed on the gate insulating layer GI. The gate electrode GATE may include (e.g., be) a conductive material. For example, the gate electrode GATE may include (e.g., be) a metal, an alloy, a conductive metal oxide, a transparent conductive material, and/or the like. For example, the gate electrode GATE may include (e.g., be) any one selected from silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), Scandium (Sc), indium tin oxide (ITO), indium zinc oxide (IZO), and/or the like.

The interlayer insulating layer ILD may be disposed on the gate insulating layer GI and may cover the gate electrode GATE. The interlayer insulating layer ILD may include (e.g., be) a silicon compound, a metal oxide, and/or the like. For example, the interlayer insulating layer ILD may include (e.g., be) silicon oxide SiOx ($SiO_x$), silicon nitride SiNx ($SiN_x$), silicon oxynitride SiNxOy ($SiN_xO_y$), and/or the like.

The source electrode SE and the drain electrode DE may be disposed on the interlayer insulating layer ILD. The source electrode SE and the drain electrode DE may include (e.g., be) a metal, an alloy, a conductive metal oxide, a transparent conductive material, and/or the like. Each of the source electrode SE and the drain electrode DE may be coupled (e.g., connected) to the active layer ACT through a contact hole. For example, the contact holes may penetrate through the interlayer insulating layer ILD and the gate insulating layer GI to expose the active layer ACT.

The via insulating layer VIA may be disposed on the interlayer insulating layer ILD and may cover the source electrode SE and the drain electrode DE. The via insulating layer VIA may include (e.g., be) a silicon compound, a metal oxide, and/or the like. In some embodiments, the via insulating layer VIA may be formed of an organic insulating material such as polyimide (PI).

The pixel defining layer PDL may be disposed on the via insulating layer VIA. In some embodiments, the pixel defining layer PDL may include (e.g., be) an organic insulating material. For example, the pixel defining layer PDL may include (e.g., be) an organic insulating material such as polyimide (PI) and/or hexamethyldisiloxane.

The lower electrode PE1 may be coupled (e.g., connected) to the drain electrode DE, but the present disclosure is not limited thereto. The lower electrode PE1 may include (e.g., be) a metal, an alloy, a conductive metal oxide, a transparent conductive material, and/or the like. The lower electrode PE1 may receive a signal through the transistor TFT. In some embodiments, the lower electrode PE1 may be an anode electrode.

The intermediate layer EL may emit light. The intermediate layer EL may include a hole injection layer, a hole transport layer, a light emitting layer, an electron transport layer, and/or an electron injection layer. In some embodiments, the intermediate layer EL may emit blue light. In some embodiments, the intermediate layer EL may emit light of various suitable colors.

The upper electrode PE2 may be disposed on the intermediate layer EL. The upper electrode PE2 may include (e.g., be) a metal, an alloy, a conductive metal oxide, a transparent conductive material, and/or the like. In some embodiments, the upper electrode PE2 may be a cathode electrode.

The encapsulation layer TFE may be disposed on the upper electrode PE2. The encapsulation layer TFE may have a structure in which an organic layer and an inorganic layer are stacked. For example, the encapsulation layer TFE may include a first inorganic layer, a first organic layer disposed on the first inorganic layer, and a second inorganic layer disposed on the first organic layer. In addition, the encapsulation layer TFE may include more organic and inorganic layers.

FIG. 10 may illustrate a part of the substrate SUB. In some embodiments, the substrate SUB may include the transistor TFT and the organic light emitting diode OLED.

The display device according to the embodiments may be applied to a display device included in a computer, a notebook, a mobile phone, a smartphone, a smart pad, a PMP, a PDA, an MP3 player, or the like within the spirit and the scope of the present disclosure. In some embodiments, the base substrate BS may have a structure in which at least one organic film layer and at least one barrier layer are alternately stacked.

Although the display devices according to embodiments have been described with reference to the drawings, the illustrated embodiments are examples, and may be suitably modified and suitably changed by a person having ordinary skill in the art without departing from the technical spirit as defined in the following claims and equivalents thereof.

What is claimed is:

1. A display device comprising:
   a substrate;
   a first color conversion layer on the substrate;
   a low refractive layer on the first color conversion layer and comprising low refractive structures;
   a planarization layer on the low refractive layer; and
   a first color filter on the planarization layer,
   wherein the planarization layer comprises a first portion forming a layer separated from the low refractive structures and positioned between the first color filter and the low refractive structures, and a second portion between the low refractive structures.

2. The display device of claim 1, further comprising:
   a second color conversion layer and a compensation layer, each being on the substrate and on a same layer as the first color conversion layer is on.

3. The display device of claim 2, wherein the low refractive layer is also on the second color conversion layer.

4. The display device of claim 2, wherein the low refractive layer is also on each of the second color conversion layer and the compensation layer.

5. The display device of claim 2, wherein the first color conversion layer, the second color conversion layer, and the compensation layer are separated from each other by a partition wall.

6. The display device of claim 2, further comprising:
   a second color filter and a third color filter, each being on the planarization layer,
   wherein the first color filter overlaps the first color conversion layer, the second color filter overlaps the second color conversion layer, and the third color filter overlaps the compensation layer.

7. The display device of claim 1, wherein at least some of the low refractive structures are different from the remaining low refractive structures in index of refraction.

8. The display device of claim 1, wherein a shell of at least some of the low refractive structures and a shell of the remaining low refractive structures are different from each other in thickness.

9. The display device of claim 1, wherein the low refractive structures comprise a silica-based material.

10. The display device of claim 1, wherein the planarization layer comprises an organic material.

11. The display device of claim 1, wherein the planarization layer comprises an inorganic material.

12. A display device comprising:
    a substrate;
    a first color conversion layer on the substrate;
    a low refractive layer above the first color conversion layer and comprising low refractive structures, a plurality of the low refractive structures being arranged above, and overlapping with, the first color conversion layer; and
    a first color filter above the low refractive layer,
    wherein the first color filter also permeates between the plurality of the low refractive structures.

13. The display device of claim 12, further comprising:
    a second color conversion layer and a compensation layer, each being on the substrate and on a same layer as the first color conversion layer is on.

14. The display device of claim 13, wherein the low refractive layer is also on the second color conversion layer.

15. The display device of claim 13, wherein the low refractive layer is also on each of the second color conversion layer and the compensation layer.

16. The display device of claim 13, wherein the first color conversion layer, the second color conversion layer, and the compensation layer are separated from each other by a partition wall.

17. The display device of claim 13, further comprising:
    a second color filter and a third color filter, each being on the low refractive layer,
    wherein the first color filter overlaps the first color conversion layer, the second color filter overlaps the second color conversion layer, and the third color filter overlaps the compensation layer, and
    wherein the second color filter and the third color filter are each between the low refractive structures.

18. The display device of claim 12, wherein at least some of the low refractive structures are different from the remaining low refractive structures in index of refraction.

19. The display device of claim 12, wherein a shell of at least some of the low refractive structures and a shell of the remaining low refractive structures are different from each other in thickness.

20. The display device of claim 12, wherein the low refractive structures comprise a silica-based material.

21. A display device comprising:
    a substrate;
    a first color conversion layer on the substrate;
    a low refractive layer above the first color conversion layer and comprising low refractive structures; and
    a first color filter above the low refractive layer,
    wherein the first color filter also permeates between the low refractive structures, and
    wherein the low refractive structures are spherical low refractive structures.

* * * * *